United States Patent
Groh

(10) Patent No.: US 9,667,214 B2
(45) Date of Patent: May 30, 2017

(54) DYNAMIC COMPRESSOR WITH "RELEASE" FEATURE

(71) Applicant: INSTITUT FUR RUNDFUNKTECHNIK GMBH, Munich (DE)

(72) Inventor: Jens Groh, Munich (DE)

(73) Assignee: Institut Fur Rundfunktechnik GMBH, Munich (DE)

( * ) Notice: Subject to any disclaimer, the term of this patent is extended or adjusted under 35 U.S.C. 154(b) by 0 days.

(21) Appl. No.: 14/783,786

(22) PCT Filed: Apr. 10, 2014

(86) PCT No.: PCT/EP2014/057310
§ 371 (c)(1),
(2) Date: Oct. 9, 2015

(87) PCT Pub. No.: WO2014/167070
PCT Pub. Date: Oct. 16, 2014

(65) Prior Publication Data
US 2016/0036405 A1    Feb. 4, 2016

(30) Foreign Application Priority Data

Apr. 11, 2013   (IT) .............................. TO2013A0292

(51) Int. Cl.
*H03G 7/00*   (2006.01)

(52) U.S. Cl.
CPC ............ *H03G 7/007* (2013.01); *H03G 7/002* (2013.01)

(58) Field of Classification Search
CPC .............................. H03G 7/007; H03G 7/002
(Continued)

(56) References Cited

U.S. PATENT DOCUMENTS

| 4,701,953 A | 10/1987 | White |
| 4,747,143 A | 5/1988 | Kroeger et al. |

(Continued)

FOREIGN PATENT DOCUMENTS

WO    01/26221 A1    4/2001

OTHER PUBLICATIONS

International Search Report and Written Opinion dated May 23, 2014, issued in PCT Application No. PCT/EP2014/057310, filed Apr. 10, 2014.

*Primary Examiner* — Melur Ramakrishnaiah
(74) *Attorney, Agent, or Firm* — Workman Nydegger

(57) ABSTRACT

A dynamic range compressor includes an input terminal for receiving input signal to be compressed, an amplifier unit for amplifying the signal to be compressed by an amplification factor, for deriving a compressed output signal, an output terminal for supplying the compressed output signal, a first envelope detector unit for deriving a first envelope signal from the input signal, and an amplifier control unit for generating an amplifier control signal in dependence of an envelope signal. Further including a second envelope detector unit for deriving a second envelope signal from the input signal, a first signal level prediction unit for generating a first prediction signal from the first envelope signal, a second signal level prediction unit for generating a second prediction signal from the second envelope signal, and a signal combination unit for combining the first and second prediction signals to generate a combined prediction signal.

13 Claims, 6 Drawing Sheets

(58) Field of Classification Search
USPC .......................... 381/106–107, 56, 312, 317
See application file for complete search history.

(56) References Cited

U.S. PATENT DOCUMENTS

| | | | |
|---|---|---|---|
| 6,757,396 B1* | 6/2004 | Allred | H03G 7/007 381/106 |
| 2005/0147262 A1 | 7/2005 | Breebaart | |
| 2006/0262938 A1* | 11/2006 | Gauger | G10L 21/02 381/56 |
| 2009/0161889 A1 | 6/2009 | Magrath | |
| 2011/0268301 A1* | 11/2011 | Nielsen | G10L 21/02 381/321 |

* cited by examiner

DYNAMIC COMPRESSOR WITH "RELEASE" FEATURE

The invention refers to a dynamic compressor in accordance with the Preamble of Claim 1. A dynamic compressor of this type is known from a Master's thesis of the Queen Mary, University of London, entitled 'A Design of a Digital, Parameter-automated, Dynamic Range Compressor' by Dimitrios Giannoulis, dated 26 Aug. 2010.

DESCRIPTION OF THE PRIOR ART

In conventional dynamic compressors for audio signals, envelope signals are detected and a gain factor generator is controlled using these envelope signals.

There are techniques to lend the envelope signals an extended decay ("release") because this allows signal distortions to be minimised.

Those conventional dynamic compressors, which work with forward control are specifically considered here because these have the advantage of little time delay; this advantage should be maintained.

Conventional dynamic compressors can be provided with a parameter regulator for the gain factor generator, which is provided to control the level value of the dynamically compressed signal. As a rule, this parameter control is based on a comparison with a target level value and a characteristic variable compression curve of the gain factor generator.

In cases, in which the application of the characteristic compression curve reduces the average level of the dynamically compressed signal in comparison with the input signal, there are techniques for equalising the amplification, known as "auto make-up gain", which can work statically or signal-dependently. [Giannoulis, section 3.4, page 42]

DESCRIPTION OF THE INVENTION

When a level measurement is derived from the envelope with release properties in order to use this for comparison with the target level value, this has the disadvantage that an additional level error of the dynamically compressed signal may arise, which is in the order of magnitude of several dB and hence is potentially not tolerable.

The object of the invention is to reduce this level error.

The dynamic compressor, as defined in the preamble, is also identified in the characteristic part of the first Claim. Preferred embodiments of the invention are identified in Claims 2 to 7.

The invention functions as follows.

In accordance with the invention, two different envelopes are derived from the input signal: the first envelope detector without release properties and the second envelope with release properties. This takes place using two associated envelope detectors, where the input signal is fed into the first envelope and the second envelope detector is coupled to the first envelope detector in series and is designed so that it generates the envelope signal with release properties from the envelope signal without release properties. It is also possible, however, for the input signal to be fed into both envelope detectors and the second envelope detector to be designed so that it generates the envelope signal with release properties directly from the input signal. The second envelope signal corresponds to the signal which is also fed into the gain factor generator of the dynamic compressor as the input signal.

A predicted envelope signal is derived from each of two envelope signals: the first predicted envelope signal from the envelope signal without release properties, the second predicted envelope signal from the envelope signal with release properties, and both from the current gain factor of the dynamic compressor. The respective predicted envelope signal comes about as a result of the multiplication of the respective envelope signal with the gain factor value. These predicted envelope signals provide estimated values of the corresponding, measurable envelopes of the compressed signal occurring due to the given gain factor value. In fact, however, envelopes of the compressed signal are not measured. A predicted level is derived from each of the two predicted envelope signals using the customary technique. A gain correction factor is derived by calculating the difference between both predicted levels. This provides information about the amount by which the levels of the compressed signal occurring due to the given gain factor value would vary if the gain factor value were derived from the envelope signal without release properties rather than from the envelope signal with release properties.

The level target value of the dynamic compressor is corrected by the gain correction factor. Thus, the above-mentioned level error is compensated.

These and further objects are achieved by means of a dynamic compressor as described in the attached claims, which are considered an integral part of the present description.

BRIEF DESCRIPTION OF THE FIGURES

The invention is further explained in the following figure description by reference to examples embodiment of the dynamic compressor according to the invention. Here.

DESCRIPTION OF THE FIGURES

Figure 1:
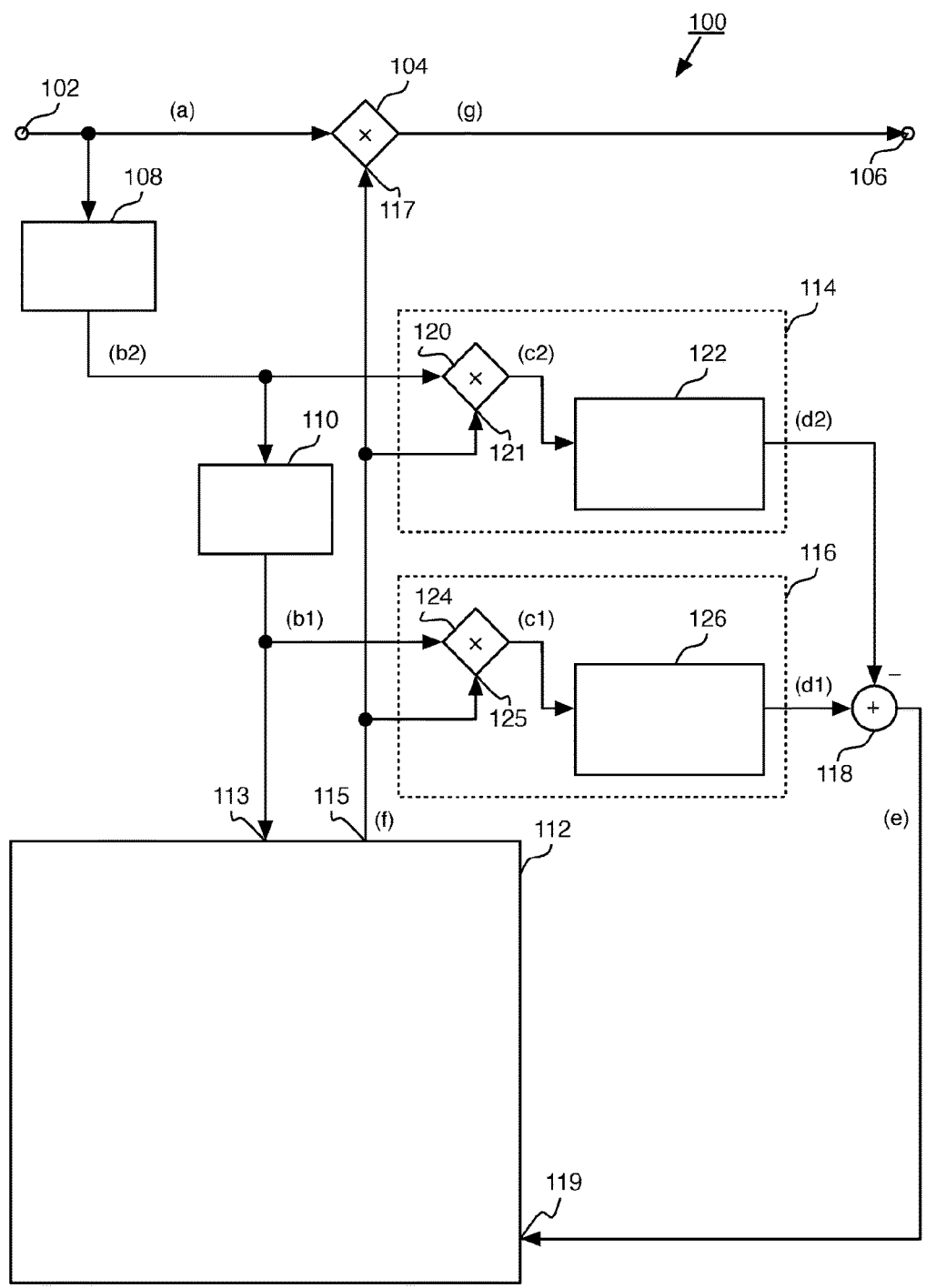
FIG. 1 depicts an example embodiment of the dynamic compressor.

FIG. 1 depicts a first example embodiment of the dynamic compressor.

The dynamic compressor 100 in FIG. 1 is provided with an input terminal 102 for receiving an input signal to be compressed. The input terminal 102 is coupled to an input of an amplifier device 104, which is equipped for amplifying the input signal to be compressed with a gain factor, to obtain a compressed output signal. An output of the amplifier device 104 is coupled to an output terminal 106 for generating the compressed output signal.

A first envelope detector unit 108 is provided for deriving a first envelope signal from the input signal. For this purpose, an input of the first envelope detector unit 108 is coupled to the input terminal 102 of the dynamic compressor. A second envelope detector unit is provided to derive a second envelope signal from the input signal. In this example embodiment, the second envelope detector unit is formed by a series of blocks 108, that is, the first envelope detector unit, and 110. In addition, the dynamic compressor 100 incorporates an amplifier control unit 112 for generating an amplifier control signal as a function of an envelope signal. For this, an input 113 of the amplifier control unit 112 is coupled to an output of the second envelope detector unit 108, 110. An output 115 of the amplifier control unit 112 is coupled to a control signal input 117 of the amplifier device 104.

The dynamic compressor is also provided with a first level prediction unit 114 for generating a first prediction signal from the first envelope signal. For this, an input of the first level prediction unit 114 is coupled to an output of the first envelope detector unit 108.

A second level prediction unit 116 is provided for generating a second prediction signal from the second envelope signal. For this, an input of the second level prediction unit 116 is coupled to the output of the second envelope detector unit 108, 110.

Outputs of the first and second prediction units 114 and 116 are coupled to corresponding inputs of a signal combining unit 118, which is equipped to combine the first and second prediction signals for obtaining a combined prediction signal. In accordance with the invention, the amplifier control unit 112 is also equipped for generating the amplifier control signal as a function of the combined prediction signal. For this, an output of the signal combining unit 118 is coupled to a second input 119 of the amplifier control unit 112.

In the example embodiment in accordance with FIG. 1, an input of the second envelope detector unit 110 is coupled to an output of the first envelope detector unit 108. It would also be possible for the input of the second envelope detector unit 110 to be coupled directly to the input terminal 102 of the dynamic compressor. In this case, the signal processing in the second envelope detector unit is equivalent to the sequential signal processing in the detector units 108 and 110, as they are switched in FIG. 1.

The first prediction unit 114 is provided with a multiplication unit 120 for multiplying the first envelope signal with a first multiplication factor as a function of the amplifier control signal. For this, an input of the multiplication unit 120 is coupled to the output of the first envelope detector unit 108 and a control signal input 121 of the multiplication unit 120 is coupled to the output 115 of the amplifier control unit 112. In addition, a level measuring device 122 is provided for deriving the first prediction signal from the first envelope signal multiplied in the multiplying unit 120.

The second prediction unit 116 is provided with a multiplication unit 124 for multiplying the second envelope signal with a second multiplication factor as a function of the amplifier control signal. For this, an input of the multiplication unit 124 is coupled to the output of the second envelope detector unit 108, 110 and a control signal input 125 of the multiplication unit 124 is coupled to the output 115 of the amplifier control unit 112. In addition, a level measuring device 126 is provided for deriving the second prediction signal from the second envelope signal multiplied in the multiplication unit 124.

Envelope detectors, such as the first envelope detector unit 108, are generally known and typically incorporate a rectifier and a low-pass filter. The block 110 incorporates a release circuit, also generally known, which typically incorporates a storage element, such as a capacitor, which is charged quickly, but discharges slowly. The second envelope detector unit 108, 110 is thus an envelope detector with release properties.

Figure 2:
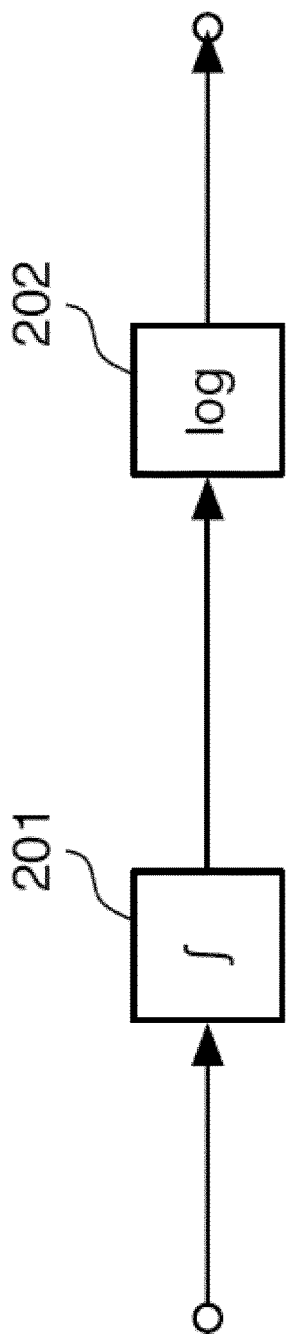
FIG. 2 depicts an example embodiment of a level prediction unit in the dynamic compressor in FIG. 1.
Figure 3:
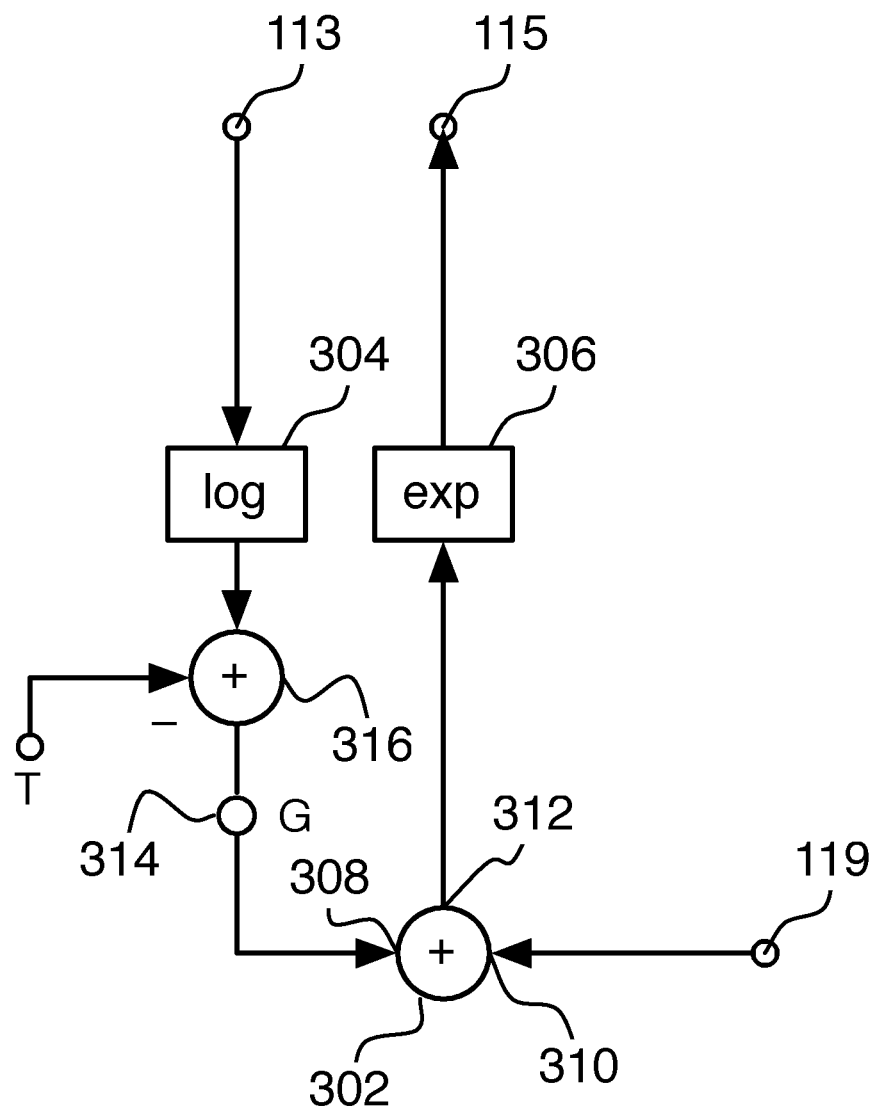
FIG. 3 depicts an example embodiment of the amplifier control unit in the dynamic compressor in FIG. 1.

In the example embodiment in FIG. 1, the level measuring devices 122 and 126 may be built from a series circuit of an integrator circuit 201 and a logarithmising circuit 202, as shown in FIG. 2. In this way, the prediction signals are generated as prediction signals converted in the logarithmised region. In this case, the signal combining unit 118 is a subtracting circuit. If the prediction signals were generated in the non-logarithmised region, the signal combining unit would be a dividing circuit.

Where the combined prediction signal 119 has been generated in the logarithmised region, the amplifier control unit 112 may appear as shown in FIG. 3. The amplifier control unit 112 in FIG. 3 incorporates a signal combining unit 302, a first converter 304 and a second converter 306. The first converter 304 is configured for receiving the envelope signal from the second envelope detector unit 108, 110 and for converting the envelope signal into the logarithmised region. For this, the output of the converter 304 is coupled to an input 308 of the signal combining unit 302. The input 119 of the amplifier control unit 112 is coupled to a second input 310 of the signal combining unit 302. An output 312 of the signal combining unit 302 is coupled to an input of the converter 306. If the input signals of the signal combining unit 302 are both in the logarithmised region, then the signal combining unit 302 is configured as an adding circuit. The second converter 306 is configured for receiving the output signal of the signal combining unit 312 and for converting this output signal in the non-logarithmised region.

Where the combined prediction signal has been generated in the non-logarithmised region, the signal combining unit 302 is configured as a multiplying circuit and the converters 304 and 306 can be omitted.

In addition, there may be another scaling circuit 314 in the amplifier control unit 112, which, if the signals in the amplifier control unit 112 are in the logarithmised region, is realised as a multiplying circuit, for multiplying the output signal of the converter 304 with a value G. If the signals are in the amplifier control unit 112 in the non-logarithmised region, then the scaling circuit 314 is an exponentiating circuit, whereby the output signal of the converter 304 is exponentiated with the value G. This scaling circuit 314 enables the level of compression of the dynamic compressor to be set as required by selecting the value G. Here, G is typically in the [−1,0] region, although not necessarily restricted to this. If G=0, then no dynamic compression occurs. If, for example, G=−1, then an intense dynamic compression occurs.

Another signal combining unit 316 may possibly be interposed between the converter 304 and the signal combining unit 314. In the logarithmised region, this signal combining unit 316 is a subtracting circuit; otherwise, it is a dividing circuit. This signal combining unit 316 allows the level operating point of the dynamic compressor to be set as required. The level operating point corresponds to the value T, whereby in the logarithmised region T is a level value based on the level value of the input signal, or else a factor based on the amplitude of the input signal.

Figure 4:
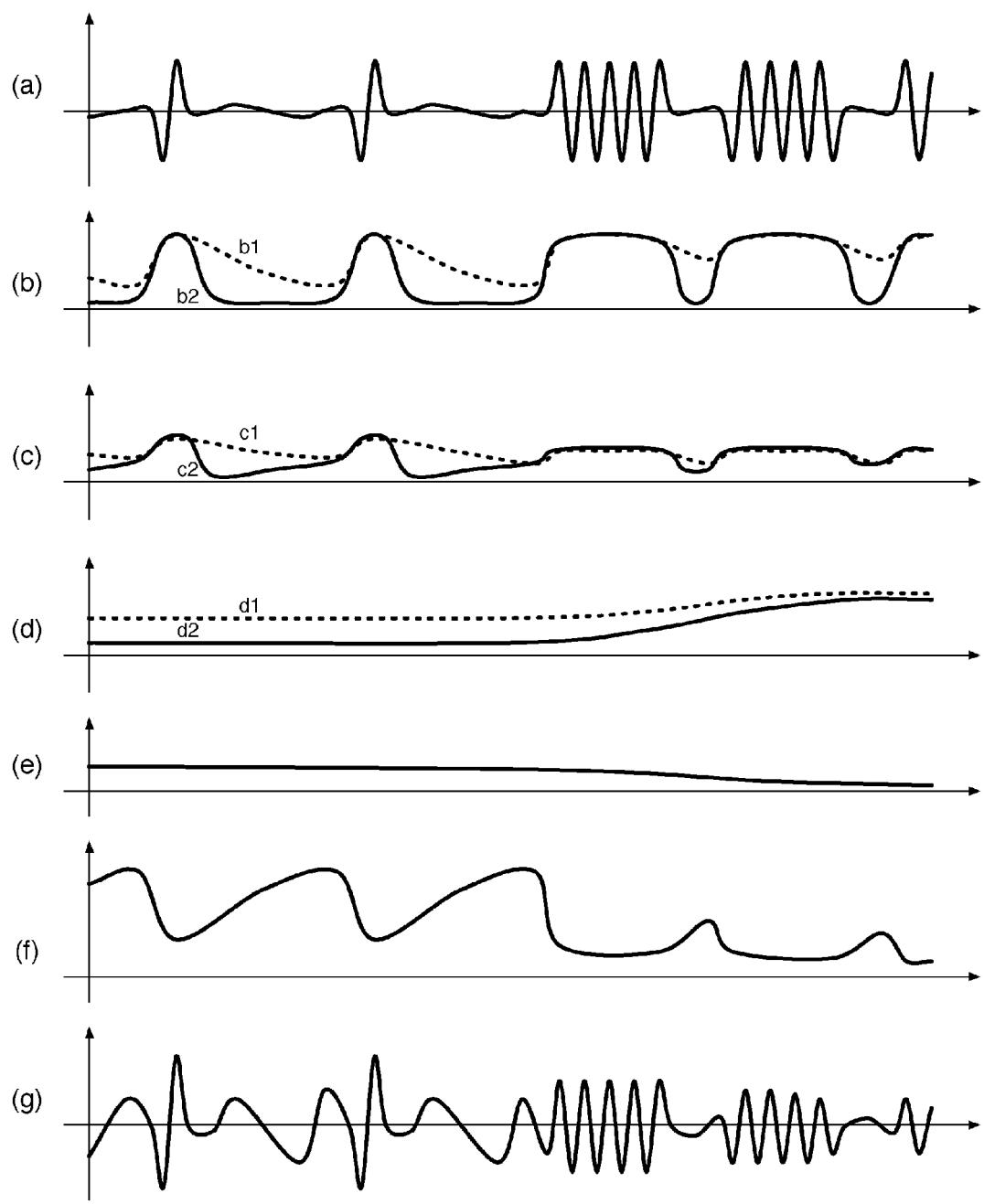
FIG. 4 depicts the behaviour of various signals in the dynamic compressor in FIG. 1.

The behaviour of certain signals in the dynamic compressor in FIG. 1 is represented in FIG. 4. The input signal at the input terminal 102 is depicted in FIG. 4a as a function of time. As can be seen in FIG. 4a, low-amplitude signal components are alternated with high-amplitude signal components, whereas the pauses, i.e. the low-amplitude segments on the left-hand side make up a large fraction and make up a small fraction on the right-hand side. The continuous line b2 in FIG. 4b depicts the output signal of the first envelope detector unit 108. It can be seen in FIG. 4b that the output signal of the envelope detector unit 108 rapidly follows the decreasing amplitudes of the input signal a. The continuous line b1 in FIG. 4b depicts the output signal of the second envelope detector unit 108,110. It can be seen in FIG. 4b that the output signal of the envelope detector unit 108,110 only very slowly follows the decreasing amplitudes of the input signal a.

The continuous line c2 in FIG. 4c depicts the output signal of the first multiplication unit 120 and the continuous line c1 depicts the output signal of the second multiplying unit 124. Here, the effect of the multiplication by the amplifier control signal f, which will also be described below, becomes evident. The ripple of the output signals of the multiplication units 120 and 124 is smaller, compared with the output signals of both envelope detectors 108 or 108, 110. Therefrom, it is discernible that the output signal of the multiplication unit 124 behaves as if it had an imagined envelope of the compressed output signal, and that the output signal of the multiplication unit 120 behaves as if it had another imagined envelope of the compressed output signal in the hypothetical case where the amplifier control signal had been derived from the envelope signal without release properties b2, rather than from the envelope signal with release properties b1.

The continuous line d2 in FIG. 4d depicts the output signal of the first predictor unit 114 and the continuous line d1 depicts the output signal of the second prediction unit 116. Due to the release properties in the block 110, the output signal d1 of the prediction unit 114 is greater than the output signal d2 of the prediction unit 116. Both signals, d1 and d2, display an increasing level as soon as the pause fraction of the input signal a becomes smaller. The increase, however, is smaller for the signal, which was derived from the envelope with release properties, namely d1

FIG. 4e depicts the output signal e of the signal combining unit 118. As can be seen in FIG. 4d, both signals d1 and d2 converge during the interval in which the pause fraction of the input signal a is smaller. This means that the output signal e of the signal combining unit 118 becomes smaller over this interval.

FIG. 4f depicts the amplifier control signal f of the amplifier control unit 112, and FIG. 4g then depicts the dynamically compressed output signal g of the dynamic compressor 100. The dynamic compression can be recognised insofar as, compared with the input signal a, the differences between low amplitude and high amplitude have become smaller for the signal g.

Figure 5:
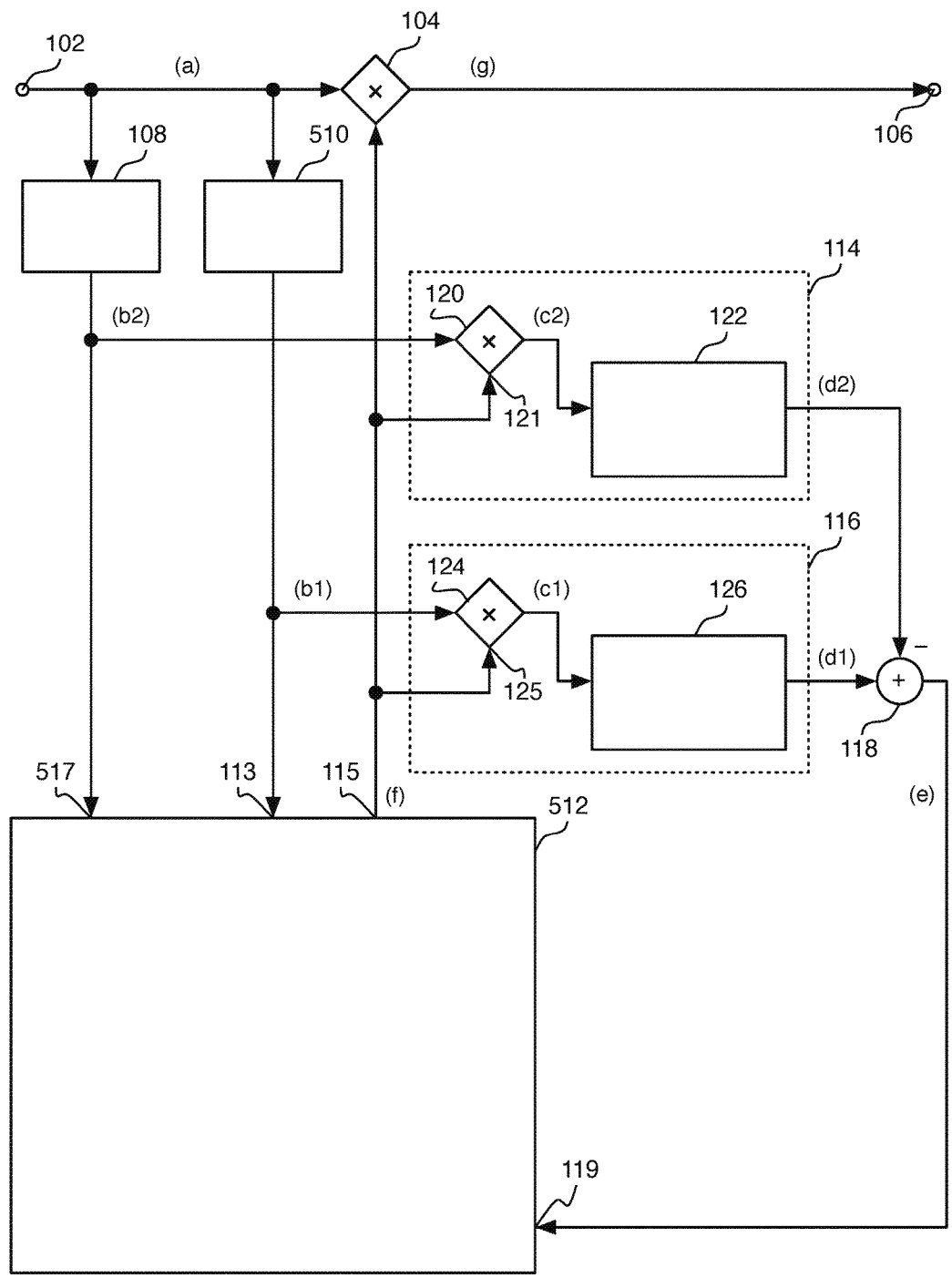
FIG. 5 depicts a second example embodiment of the dynamic compressor in accordance with the invention and FIG. 6 depicts an example embodiment of the amplifier control unit of the dynamic compressor in accordance with FIG. 5.

FIG. 5 depicts a second example embodiment of the dynamic compressor in accordance with the invention. The dynamic compressor in accordance with FIG. 5 depicts great similarities with the dynamic compressor in accordance with FIG. 1. Similar elements of the dynamic compressors are indicated with the same reference numbers in both Figures. The differences consist in another design of the second envelope detector unit, indicated in FIG. 5 by 510, and of the amplifier control unit, indicated in FIG. 5 by 512. The envelope detector unit 510 is constructed from a series circuit of the blocks 108 and 110 in FIG. 1 and works in the same way. It can also be seen that the output of the envelope detector unit 108 is also coupled to a third input 517 of the amplifier control unit 512.

Figure 6:
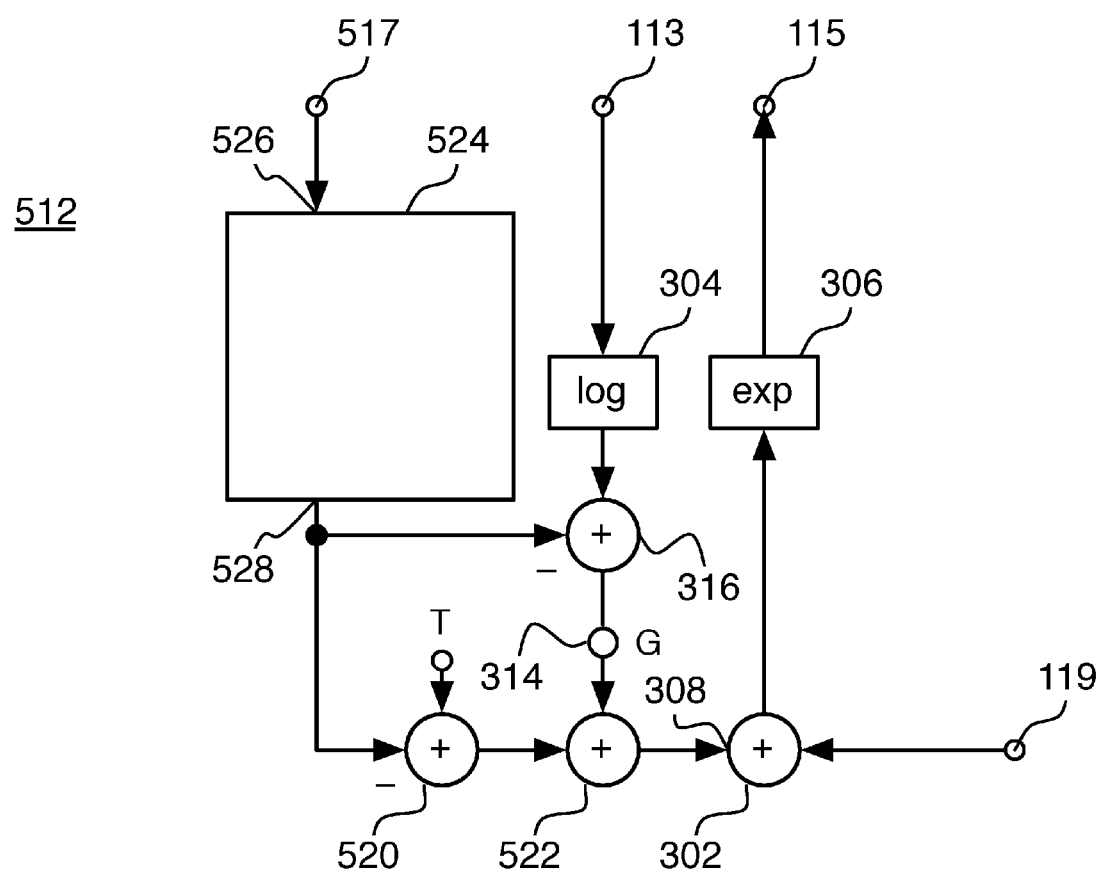

On the other hand, the amplifier control unit 512 may, where the combined prediction signal 119 was generated in the logarithmised region, appear like the unit depicted in FIG. 6. The amplifier control unit 512 in FIG. 6 is a development of the amplifier control unit 112 in FIG. 3. Elements with the same reference numbers in both amplifier control units 112 in FIGS. 3 and 512 in FIG. 6 are identical.

The amplifier control unit 512 is also provided with a signal block 524, a signal combining unit 520 and a signal combining unit 522. The input 526 of the signal block 524 is coupled to the input 517 of the amplifier control unit 512. One output 528 of the signal block 524 is coupled to a respective one input of both signal combining units 316 and 520. An output of the signal combining unit 520 is coupled to an input of the signal combining unit 522. The output of the scaling circuit 314 is coupled to a second input of the signal combining unit 522. An output of the signal combining unit 522 is coupled to the input 308 of the signal combining circuit 302.

The signal block 524 may look like the signal block in FIG. 2, already shown for the level measuring units 122 and 124. The signal block can thus also be provided with a series circuit of an integrator circuit and of a logarithmising circuit.

The signal combining unit 520 in the logarithmised region is a subtracting circuit and the signal combining unit 522 is an adding circuit. Similarly to in the amplifier control unit 112, the signal block 524 and the signal combining units 316, 520 and 522 allow the level operating point of the dynamic compressor to be set as required. On the other hand, the level operating point corresponds to the value T. In contrast to the circuit in FIG. 1 using the amplifier control unit 112 in accordance with FIG. 3, however, the circuit in FIG. 5 using the amplifier control unit 512 in accordance with FIG. 6 also allows the difference between the actual level of the input signal and the level operating point T to be taken into consideration, so that here, T is a level value based on a signal level value 0. Thus, advantageously, T can be set, even without a known input signal level.

Many changes, modifications, variations and other uses and applications of the subject invention will become apparent to those skilled in the art after considering the specification and the accompanying drawings which disclose preferred embodiments thereof. All such changes, modifications, variations and other uses and applications which do not depart from the scope of the invention are deemed to be covered by this invention.

The elements and characteristics described in the various forms of preferred embodiments can be mutually combined without departing from the scope of the invention.

Further implementation details will not be described, as the man skilled in the art is able to carry out the invention starting from the teaching of the above description.

The invention claimed is:

1. A dynamic range compressor provided with:
   a. an input terminal for receiving input signal to be compressed,
   b. an amplifier unit for amplifying the signal to be compressed by an amplification factor, for deriving a compressed output signal,
   c. an output terminal for supplying the compressed output signal,
   d. a first envelope detector unit for deriving a first envelope signal from the input signal,
   e. an amplifier control unit for generating an amplifier control signal in dependence of an envelope signal,
   wherein the dynamic compressor is further provided with
   f. a second envelope detector unit for deriving a second envelope signal from the input signal,
   g. a first signal level prediction unit for generating a first prediction signal from the first envelope signal, the first signal level prediction unit being provided with a first multiplication unit for multiplying the first envelope signal by a first multiplication factor in dependence of the amplifier control signal, h. a second signal level prediction unit for generating a second prediction signal from the second envelope signal, the second signal level prediction unit being provided with a second multiplication unit for multiplying the second envelope signal by a second multiplication factor in dependence of the amplifier control signal, i. a signal combination unit for combining the first and second prediction signals to generate a combined prediction signal, and that the amplifier control unit is adapted to generate the amplifier control signal in addition in dependence of the combined prediction signal.

2. The dynamic range compressor as claimed in claim 1, wherein the amplifier control unit is adapted to generate the amplifier control signal in dependence of the second envelope signal and the combined prediction signal.

3. The dynamic range compressor as claimed in claim 1, wherein the amplifier control unit is adapted to generate the amplifier control signal in dependence of the first and the second envelope signal and the combined prediction signal.

4. The dynamic range compressor as claimed in claim 1, wherein the first signal level prediction unit is further provided with:
a first signal level measuring unit for deriving the first prediction signal from the first envelope signal multiplied in the first multiplication unit.

5. The dynamic range compressor as claimed in claim 4, wherein the second signal level prediction unit is further provided with;
a second signal level measuring unit for deriving the second prediction signal from the second envelope signal multiplied in the second multiplication unit.

6. The dynamic range compressor as claimed in claim 1, wherein the first envelope detector unit is adapted to derive the first envelope signal as an envelope signal being devoid of a release behavior.

7. The dynamic range compressor as claimed in claim 6, wherein the second envelope detector unit is adapted to derive the second envelope signal as an envelope signal exhibiting a release behavior.

8. The dynamic range compressor as claimed in claim 5, wherein the first and second multiplication factors have an equal value.

9. The dynamic range compressor as claimed in claim 1, wherein the amplifier control unit comprises a signal combination unit for combining the envelope signal and the combined prediction signal, to derive therefrom the amplifier control signal.

10. The dynamic range compressor as claimed in claim 5, wherein
a. the first and the second prediction signals are prediction signals converted into the logarithmic domain, and the combined prediction signal is a combined prediction signal converted in the logarithmic domain, and
b. the amplification control unit a first converter for receiving the envelope signal and for converting the envelope signal into an envelope signal converted in the logarithmic domain,
c. the signal combination unit of the amplifier control signal is adapted to combine the combined prediction signal converted in the logarithmic domain and the envelope signal converted in the logarithmic domain, to generate the combination signal converted in the logarithmic domain,
d. the amplifier control unit is further provided with a second converter unit for converting the combination signal into the non-logarithmic domain, and
e. the amplifier unit is adapted to supply the non-logarithmic combination signal as the amplifier control signal.

11. The dynamic range compressor as claimed in claim 10, wherein the signal combination unit of the amplifier control unit is adapted to additionally combining a target value, to obtain the combination signal converted into the logarithmic domain.

12. The dynamic range compressor as claimed in claim 3, wherein the amplifier control unit is additionally provided with a signal level measuring unit for measuring the signal level of the first envelope signal and for converting the so derived signal level signal in a signal level signal converted in the logarithmic domain, and that the signal combination unit of the amplifier control unit is adapted to additionally combining the signal level signal converted in the logarithmic domain, to generate the combination signal converted in the logarithmic domain.

13. The dynamic range compressor as claimed in claim 1, wherein the dynamic range compressor is a forwardly controlled dynamic range compressor.

* * * * *